United States Patent [19]
Lardon et al.

[11] Patent Number: 4,915,806
[45] Date of Patent: Apr. 10, 1990

[54] PROCESS AND APPARATUS FOR COATING MICROCAVITIES

[75] Inventors: Marcel Lardon, Maienfeld; Rainer Buhl; Hans-Peter Bader, both of Sargans, all of Switzerland

[73] Assignee: Balzers Aktiengesellschaft, Fürstentum, Liechtenstein

[21] Appl. No.: 888,881

[22] Filed: Jul. 22, 1986

[30] Foreign Application Priority Data

Jul. 26, 1985 [CH] Switzerland ............... 03256/85

[51] Int. Cl.$^4$ .............................................. C23C 14/34
[52] U.S. Cl. .......................... 204/192.31; 204/298.05; 427/38; 118/723
[58] Field of Search ........... 204/192.11, 192.3, 192.31, 204/298, 298 PT; 427/42, 38; 118/723, 726

[56] References Cited

U.S. PATENT DOCUMENTS

| | | | |
|---|---|---|---|
| 3,756,193 | 9/1973 | Carmichael et al. | 204/192.31 X |
| 4,109,061 | 8/1978 | Beale et al. | 204/192.31 X |
| 4,140,546 | 2/1979 | Krimmel et al. | 204/192.11 X |
| 4,385,975 | 5/1983 | Chu et al. | 204/192.23 |
| 4,401,719 | 8/1983 | Kobayashi et al. | 204/192.31 X |
| 4,468,437 | 8/1984 | Patten et al. | 204/192.3 X |

Primary Examiner—Nam X. Nguyen
Attorney, Agent, or Firm—McGlew & Tuttle

[57] ABSTRACT

A process for coating substrates which has microcavities comprises coating the substrate surface under a vacuum with a predetermined substance to form a layer of the substance deposited on the surface and in the cavity. Directing subsequent layers onto the substrate with an ion bombardment so as to cause the molecular beams of the coating substance to strike the cavities at divergence angles of not greater than 10°.

12 Claims, 1 Drawing Sheet

PROCESS AND APPARATUS FOR COATING MICROCAVITIES

FIELD AND BACKGROUND OF THE INVENTION

This invention relates in general to substrate coating techniques and in particular to a new and useful process for coating a substrate surface which has cavities thereon of relatively small size.

Metallization in microelectronics, among other things, has to fulfill the task of ensuring electrical contact between the plane of the strip conductors and the components which lie outside of this plane and are separated from it by an insulating layer. For this purpose, the strip conductors must have the lowest possible electrical resistance, even over steep steps. This presupposes good step coverages (ratio between the layer thickness at the side of a cavity to the layer thickness in the plane of the conductor strips).

It was possible to solve the problem of step coverage by suitably orienting the substrate to be coated with respect to the coating source, by an elevated temperature and by the appropriate choice of the side angle (Ref. 1). Arrangements are known (Ref. 2), in which vaporizing sources were combined with substrates mounted on planetary gears. A further possibility consists of flattening or levelling steps by vapor-coating them with a dielectric layer before they are metallized. This process was described, above all, for $SiO_2$ layers (Ref. 2, Ref. 3). Attempts have also been made to utilize wide vapor sources, so that the vapor molecules, as far as possible, strike the substrate from all directions, in order to coat surfaces of all inclinations as uniformly as possible in this manner. A similar effect is also achieved as a result of gas scattering when the coating process is carried out at a relative high pressure (more than 0.5 Pa), for example, with so-called magnetron sources (Ref. 4).

All known processes, however, have the disadvantage that they are suitable enough for achieving a better step coverage, as long as the cavity is wide in relation to its depth, but that they fail, when the ratio of depth to width (named "aspect ratio") is about 1 or higher. Such step ratios are, however, constantly becoming more important in microelectronics for the so-called VLSI (Very Large Scale Integration) technique, which is playing a constantly more significant role in recent times.

Admittedly, by combining sputter deposition with a simultaneous sputter etching (bias sputtering), it has been possible to practically level trenches with a ratio of 1:1 with aluminum. However, when coating cavities, trenches or holes with an aspect ratio of more than one (not as wide as they are deep), difficulties do arise than with bias sputtering. Because sputter source always is an extended source, the particles strike the substrate surface, which is to be coated, at different angles. As a result, the individual edges of steps, which are far apart, are admittedly, coated well all-around, as described. For the narrow cavities considered here, however, this process of coating from all directions is disadvantageous. Thorough investigations have namely revealed that the layer grows more readily at the edges than in the remaining places of the cavities. As a result, overhangs are formed at the edges. These overhangs gradually narrow the openings of the cavities, until caves are finally formed. Such caves are undesirable, because they readily give rise to defects in the microcircuits.

SUMMARY OF THE INVENTION

The present invention reliably avoids cave formation when coating microcavities. Within the meaning of this description, microcavities are cavities in a substrate surface, which have a width of 5 μm or less, and preferably ones, in which the aspect ratio is greater than 1. The inventive process for coating microcavities less than 5 μm wide in a substrate surface, which is being coated with a specified substance, the layer substance deposited in the cavities being sputtered once again here and there by ion bombardment and deposited at other places in the cavities, is a process wherein the coating is carried out with an arrangement, in which the particle beams of the coating substance, striking the cavities, have a divergence of no more than 10°.

Surprisingly, it has turned out that the bottom and the side wall of microcavities can be coated much more uniformly with the inventive process, than was previously considered to be possible, and that even cavities with an aspect ratio of more than 1, rather than growing together at their opening due to overhang formation and, as a result, forming hollow spaces, can be filled completely with the coating material.

In carrying out the inventive process, the coating process and the sputtering can be carried out either simultaneously or in several alternating individual steps. Preferably, an arrangement is used, in which the vapor particles strike the substrate surface vertically, the coating substance being deposited at first mainly on the bottom of the cavities and reaching the side walls of the cavities only through redistribution by sputtering, which takes place simultaneously or is carried out subsequently. This occurs, as stated above, without the development of cave forming overhangs at the edges bordering the cavity, contrary to what was previously the case when coating by means of vapor particles, which could fall onto the substrate from all directions.

A coating source of a particular width may also be useful within the scope of the invention, in that the side walls of the cavities are also provided with a first coating from the very start by these means. However, the width of the coating source may, at most, be such, that the particle beam source, as seen from any point of the microcavities to be coated, appears at an angle of no more than 10°.

Aside from an appropriate source and an appropriate distance, a sufficiently large mean free path in the vacuum of the coating chamber, that is, a low pressure of the order of about 0.001 Pa, is advantageous for ensuring that all particles arrive largely unidirectionally on the substrate surface.

Accordingly, it is an object of the invention to provide an improved process for coating substrates having microcavities which comprises depositing a coating material on the walls of the microcavities of the substrate and redistributing it by ion bombardment while ensuring that the beams of the coating material strike the cavities at a divergence angle of not greater than 10°.

A further object of the invention is to provide a process for coating a substrate which is simple to carry out and economical to effect.

The various features of novelty which characterize the invention are pointed out with particularity in the claims annexed to and forming a part of this disclosure.

For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
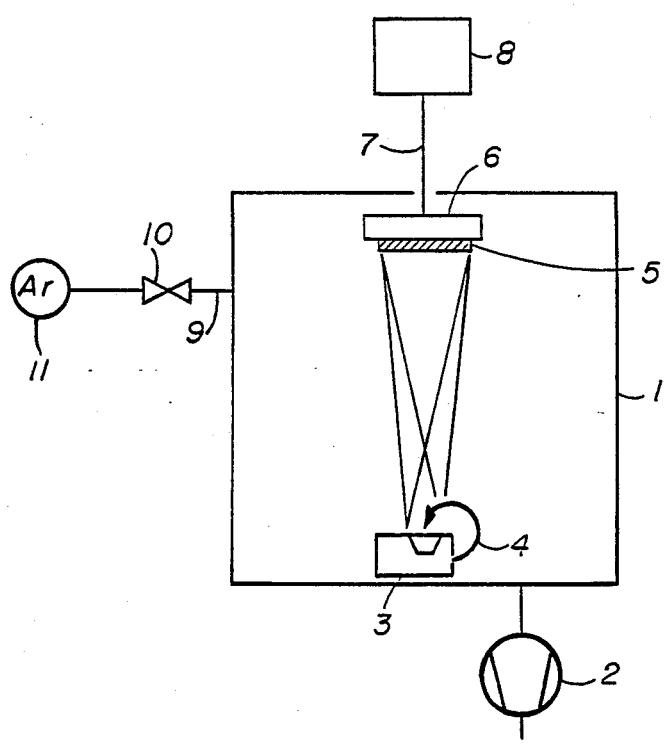
FIG. 1 is a shematic sectional view of a vacuum coating installation.

In FIG. 1, 1 denotes a housing defining a vacuum chamber, which is pumped out to a desired vacuum by means of a vacuum pump 2. A suitable source of particle beams is indicated by 3. This may, for example, be a conventional thermal vaporizer or, as shown schematically in the drawings or a so-called electron beam vaporizer, the electron beam 4 being deflected by a magnetic field into the vaporizing crucible. The particle beams, emanating from the source 3, strikes a substrate 5, which has microcavities and which is to be coated. The substrate 5 is carried by a holder 6 and can be connected over a vacuum-tight voltage lead-through with voltage supplying equipment 8. Moreover, a gas inlet 9 is provided, over which an auxiliary gas, for example, argon, can be admitted into the desired amount from reservoir 11 by means of valve 10 into the coating chamber.

For implementing the invention with such a coating arrangement, it is important that the particle beams of the coating material, which is to be applied, strike the cavities with a divergence, which is sufficiently small, that is, which is no more than 10°. This arrangement is characterized by the fact that the source of particle beams, as seen from any point of the microcavities to be coated, appears at an angle of less than 10°. From this condition and for a given width of the source supplying the particle beams, the required distance between source and substrate can easily be calculated. For a distance of 50 cm, for example, it can be calculated that the width of the source may not exceed 8.7 cm, if said divergence condition is to be fulfilled.

The angle, at which the particle beams strike the substrate, is however, not determined only by the geometric arrangement. If the coating process is carried out at a higher gas pressure in the coating chamber, as is the case, for example, when coating by means of cathode sputtering or by a so-called planar magnetron, a scattering of the particle of the coating material from the beam takes place in the gas space, and these scattered particle, as a result of multiple scattering, could finally fall on the substrate at very different angles and not only from the direction specified by the beam. However, appreciable interference due to scattering is not be expected, if the mean free path of the beam particle in the space between the source and the substrates is at least one third of the distance between source and substrate or, better yet, greater than this distance.

In a first example of the operation, pure aluminum was vaporized under a vacuum of $2.5 \times 10^{-3}$ Pa and a 0.2 μm layer was deposited on the substrate surface at a coating rate of 0.26 μm per minute. Argon was then admitted to chamber 1 up to a pressure of 0.5 Pa and a negative voltage of about 2.000 V relative to the vapor source (and, with that, relative to the walls of the coating chamber), was applied to the substrate. In so doing, an electrical gas discharge was developed. through which the aluminum was partially sputtered again from the substrate by cathode sputtering. By means of this so-called sputtering, the aluminum on the substrate was redistributed in a known manner, that is, a portion of the coating material, which had been sputtered from the substrate, was deposited on the side walls of the cavity where it formed an electrically conducting metal coating.

In a different variant, the resputtering was carried out by means of so-called high-frequency sputtering at 13.56 MHz and with an output of about 1.5 W per cm$^2$ and the same result was achieved. (However, high-frequency sputtering offers the advantage that electrically non-conductive coating materials can also be sputtered.)

The two steps of coating and resputtering, which have been described, are advantageously repeated, as a result of which a more uniform and thicker coating can be achieved also on the side walls of the microcavities. For the cavities of rectangular cross section and a depth of 1 μm, it has, for example, proven to be optimum (with respect to the time expended in production and to the quality of the coating), to apply no more than 0.2 μm per coating step on the bottom of the cavity and to repeat this coating step and resputtering 5 times.

Figure 2:
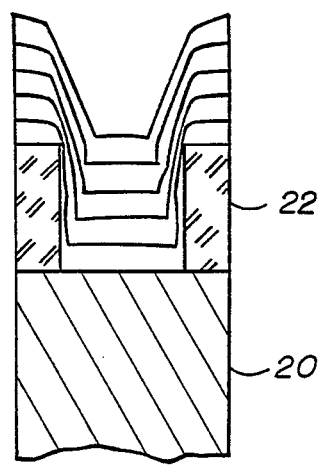
FIG. 2 is a shematic secional view showing how a layer which is applied over the cavity grows in accordance with the invention.

FIG. 2 shows the calculated material distribution for these 5 steps. In FIG. 2, 20 denotes a section from the substrate, 22 an SiO$_2$ coating in which a trench of a rectangluar cross section with width to depth ratio of 1 was engraved. The coating, described in the aforementioned example of the operation, was applied in 5 vapor-desposition and resputtering steps, as described. The profiles, which result after each cycle of vapor deposition/resputtering, are shown in FIG. 2. It is seen that no projections are formed and, above all no hollow spaces. Rather, the original cavity is completely filled with the coating material and a reliable connection between the aluminum coating applied on the substrate and the aluminum deposited in the cavity is assured.

In a further example of the operation, aluminum was vaporized once again from a small vessel or sagter in an argon atmosphere $5 \times 10^{-2}$ Pa and a coating rate of 0.09 micrometer/min was achieved with it in the given vapor deposition installation. In two minutes of vapor deposition time per vapor deposition step, a 0.19 micrometer aluminum layer was deposited on the test substrate having cavities. The resputtering step was subsequently carried out by means of a high frequency discharge, as described above (13.56 MHz, 1.6 watt/cm$^2$, $5 \times 10^{-1}$ Pa argon) and, by means of this, a substantial portion of the aluminum, deposited on the bottom of the cavities, was removed once again. The duration of the resputtering determines the magnitude of the resputtered portion. In the case of the present example, 0.13 μm of the 0.18 μm aluminum coating was removed each time by the resputtering. Vapor deposition and etching were repeated 7 times and a uniform coating of the surfaces of the cavities was achieved with this.

The most widely differing known processes for etching (resputtering) can also be used within the scope of the present invention. The etching can thus be accomplished not only with HF sputtering as mentioned in the first example, but also by means of a direct current discharge or the partial removal of the layer substance, applied in the coating step, can be brought about by means of an ion beam impinging on the places to be etched.

During the coating process of substrate surfaces having so-called microcavities (trenches, holes), which extend less than 5 μm laterally, especially of substrate surfaces having microcavities which are deeper than they are wide, the danger exists that hollow spaces will be formed in the cavities below a vapor-deposited layer. In order to avoid this, the coating process is carried out inventively with coating material molecular beams, which may have a divergence of no more that 10°, and the coating material in the cavities is partially resputtered by ion bombardment and is thus distributed better on the side walls of the cavities. The invention finds application especially in microelectronics.

While specific embodiments of the invention have been shown and described in detail to illustrate the application of the principles of the invention, it will be understood that the invention may be embodied otherwise without departing from such principles.

LIST OF REFERENCES

1. I. A. Blech and H. A. Vander Plas, J. Appl. Phys. 54, 3489 (1983); I. A. Blech, D. B. Fraser, S. E. Haszko, J. Vac. Sci. Technol. 15, 13 (1978.
2. C. H. Ting and A. R. Neureuther, Solid State Technology, February 1982 p. 115.
3. John S. Lechaton, Leo P. Richard and Daryl C. Smith, U.S. Pat. No. 3,804,738 Apr. 16, 1974.
4. D. B. Fraser, Chapter "Metallization" in "VLSI Technology", Ed. S. M. Sze, McGraw Hill 1983.
5. Y. Homma and S. Tsunekawa, Proceedings Electrochemical Society Meeting, Washington, D.C., Oct. 9-14, 1983, Abstr. No. 283; Y. Homma and S. Tsunekawa, J. Electrochem. Soc. 132, 1466 (1985)

What is claimed is:

1. A process for coating a microcavity within a surface of a substrate, comprising the steps of coating said microcavity by placing said microcavity at a distance from a particle beam emitting surface of a source for said beam, selecting said emitting surface so that at least predominant parts of said emitting surface appear under an angle of no more than 10° seen from said microcavity with respect to a normal direction on said surface of said substrate, selecting said distance with respect to said normal direction on said substrate, to be at most three times the mean free path of particles emitted from said surface to form said beam.

2. The process of claim 1, further redistributing said coating applied to said microcavity by said coating steps by ion bombardment.

3. The process of claim 2, wherein said step of coating said microcavity and of redistributing said coating are repeated at least twice.

4. The process of claim 2, wherein said step of coating and said step of redistributing are performed at least in part simultaneously.

5. The process of claim 1 for coating more than one microcavity simultaneously.

6. An apparatus for coating at least one microcavity within a surface of a substrate, comprising a vacuum chamber arrangement with a source for a particle beam, the source having a beam emitting surface, positioning means for positioning substrate with respect to said microcavity, arranged so that said emitting surface appears under an angle of not more than 10° when seen from said microcavity with respect to a normal direction on said surface of said substrate, the distance from the emitting surface with respect to said normal direction on said surface of said substrate, being at most three times the mean free path of the particles emitted by the source.

7. The apparatus of claim 6, further comprising control means to selectively operate said vacuum chamber arrangement to coat said microcavity by said beam and to redistribute coating applied by said beam within said microcavity by ion bombardment of said coated microcavity.

8. A process for coating a substantially planar surface of a substrate having microcavities, comprising the steps of: positioning a substrate within a vacuum chamber; positioning a particle beam emitting source to direct the particle beam at the substrate at an angle of no more than 10° with respect to a normal direction on the surface of the substrate; and, positioning the particle beam emitting source a distance in said normal direction from the substrate surface which is at most three times the mean free path of particles emitted from the particle beam source.

9. The process of claim 8, further redistributing said coating applied to said microcavity by said coating steps by ion bombardment.

10. The process of claim 9, wherein said step of coating said microcavity and of redistributing said coating are repeated at least twice.

11. The process of claim 9, wherein said step of coating and said step of redistributing are performed at least in part simultaneously.

12. The process of claim 8 for coating more than one microcavity simultaneously.

* * * * *